United States Patent [19]
Lin

[11] Patent Number: 5,547,900
[45] Date of Patent: Aug. 20, 1996

[54] METHOD OF FABRICATING A SELF-ALIGNED CONTACT USING A LIQUID-PHASE OXIDE-DEPOSITION PROCESS

[75] Inventor: Jengping Lin, Taoyuan Hsien, Taiwan

[73] Assignee: United Microelectronics Corporation, Hsinchu, Taiwan

[21] Appl. No.: 450,891

[22] Filed: May 26, 1995

[51] Int. Cl.$^6$ ................................................ H01L 21/28
[52] U.S. Cl. ........................ 437/187; 437/41; 437/984; 437/193
[58] Field of Search .................................. 437/186, 187, 437/193, 191, 41, 984, 228, 41 R, 41 LDD, 41 SM, 228 SD, 228 COW

[56] References Cited

U.S. PATENT DOCUMENTS

| | | | |
|---|---|---|---|
| 5,270,233 | 12/1993 | Hamatake | 437/57 |
| 5,286,664 | 2/1994 | Horiuchi | 437/29 |
| 5,304,510 | 4/1994 | Suguro et al. | 437/195 |
| 5,378,654 | 1/1995 | Hsue | 437/195 |
| 5,429,956 | 7/1995 | Shell et al. | 437/44 |

OTHER PUBLICATIONS

S. Wolf "VLSI Processing for the VLSI Era, vol. I", Lattice Press, pp. 384, 385, 1986.

*Primary Examiner*—George Fourson
*Assistant Examiner*—Thomas G. Bilodeau
*Attorney, Agent, or Firm*—Ladas & Parry

[57] ABSTRACT

This invention provides a method of fabricating a self-aligned contact of a semiconductor device using a liquid-phase oxide-deposition (LPD) process. A gate electrode and source/drain regions are formed on a semiconductor substrate. A layer of photoresist is coated and patterned overlying an area of the semiconductor substrate that will form a contact. Using the photoresist as a mask, an oxide layer is formed in self-aligned manner by a liquid-phase deposition process. The photoresist is removed to expose a contact portion of the source/drain regions. An interlevel conductive layer is formed on the semiconductor substrate, wherein the interlevel conductive layer is connected to the source/drain regions through the contact portion.

7 Claims, 6 Drawing Sheets

5,547,900

METHOD OF FABRICATING A SELF-ALIGNED CONTACT USING A LIQUID-PHASE OXIDE-DEPOSITION PROCESS

BACKGROUND OF THE INVENTION

1. Field of the Invention

The present invention relates in general to the manufacture of semiconductor integrated circuits (IC), and more particularly to a method of fabricating contacts of semiconductor devices in a self-aligned manner by using a liquid-phase oxide-deposition (LPD) process.

2. Description of the Prior Art

A self-aligned contact process is an ordinary method used in the fabrication of semiconductor devices. FIGS. 1a to 1e show, in cross-sectional view, the process steps of a prior art self-aligned contact process. First, referring to FIG. 1a, first oxide layer 12, first polysilicon layer 11, and second oxide layer 13 are formed on semiconductor substrate 1 successively. First polysilicon layer 11 can be implanted with impurities to improve its conductivity. Next, second oxide layer 13, first polysilicon layer 11, and first oxide layer 12 are patterned by lithography and etching processes to form gate electrode 18 and expose area 16 of the semiconductor substrate 1 for source/drain regions. Using gate electrode 18 as a mask, an impurity is implanted into area 16 to form lightly doped source/drain regions 32. Third oxide layer 14 is then deposited on the surfaces of gate electrode 18 and lightly doped source/drain regions 16.

Referring to FIG. 1b, third oxide layer 14 is anisotropically etched, preferably by reactive ion etching (RIE), to leave first sidewall spacer 27 on the sidewalls of gate electrode 18. Similarly, an impurity is then implanted into area 16 to form heavily doped source/drain regions 31 using the gate electrode 18 and the first sidewall spacer 27 as a mask. Fourth oxide layer 35 is deposited on the surfaces of gate electrode 18, first sidewall spacer 27, and heavily doped source/drain regions 31.

Referring to FIG. 1c, layer of photoresist 45 is coated and patterned by a lithography process. Fourth oxide layer 35 is then anisotropically etched preferably by RIE to expose a portion of heavily doped source/drain regions 31, namely contact 29. To ensure that no residue of fourth oxide layer 35 is left on contact 29, an over-etching is usually used at this stage. This will lead to the formation of over-etched area 37 in second oxide layer 13, which may likely cause an electrical short circuit. In addition, second sidewall spacer 28 is also formed on the sidewalls of first sidewall spacers 27 due to the fact that fourth oxide layer 35 is etched anisotropically.

Referring to FIG. 1d, photoresist 45 is removed by an appropriate solvent. Second polysilicon layer 46 is then deposited on the exposed surfaces of the substrate. Second polysilicon layer 46 is connected to heavily doped source/drain regions 31 through the contact 29 in a self-aligned manner. Finally, as can be seen in FIG. 1e, second polysilicon layer 46 is patterned by a lithography and etching processes to form interlevel conductive layer 42.

The prior art self-aligned contact process, however, has two drawbacks. First, gate electrode 18 is likely to short to contact 29 since second oxide layer 13 over gate electrode 18 (i.e. over-etched area 37) is easily etched away while anisotropically etching fourth oxide layer 35. Second, the area of contact 29 is reduced due to the formation of second sidewall spacer 28 on the sidewalls of first sidewall spacer 27. Therefore, a need has arisen for a simple and more reliable process to form a self-aligned contact of a semiconductor device which overcomes the drawbacks of the prior art process.

SUMMARY OF THE INVENTION

Accordingly, it is an object of the present invention to provide a method of fabricating a self-aligned contact of a semiconductor device capable of preventing the over-etching problem and the contact area reduction.

In accordance with the object of the present invention, a method of fabricating a self-aligned contact of a semiconductor device using the liquid-phase oxide-deposition (LPD) process is achieved. First, a gate electrode and source/drain regions are formed on a semiconductor substrate. A layer of photoresist is coated and patterned overlying an area of the semiconductor substrate that will form a contact. Next, using the photoresist as a mask, an oxide layer is formed in a self-aligned manner by a liquid-phase deposition process. After that, the photoresist is removed to expose a contact portion of the source/drain regions. Finally, an interlevel conductive layer is formed on the semiconductor substrate, wherein the interlevel conductive layer is connected to the source/drain regions through the contact portion.

BRIEF DESCRIPTION OF THE DRAWINGS

The present invention will be more fully understood from the following detailed description of the preferred embodiment with reference to the accompanying drawings, wherein.

DETAILED DESCRIPTION OF THE PREFERRED EMBODIMENT

Figure 1A:
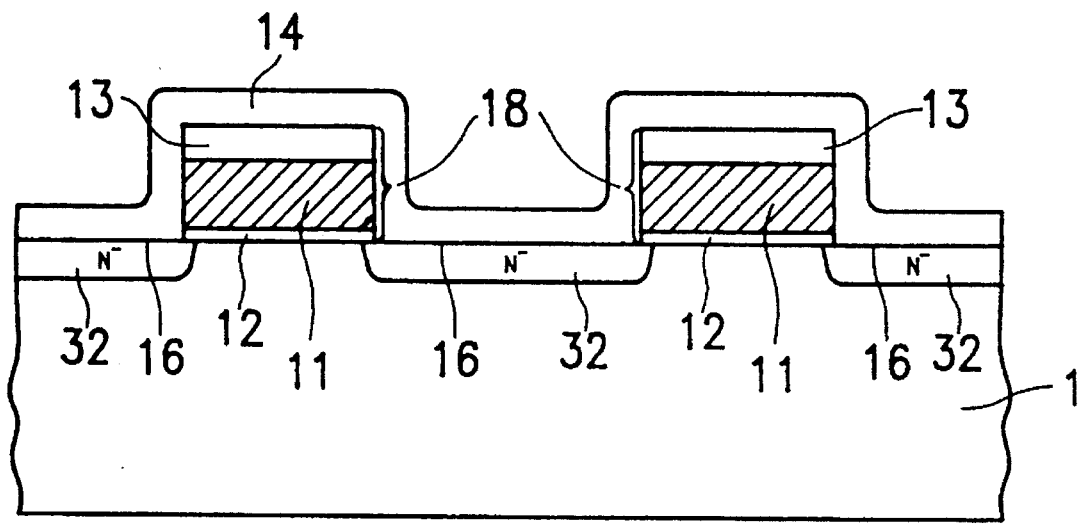
FIGS. 1a to 1e illustrate, in cross-sectional view, the prior art process steps for fabricating a self-aligned contact of a semiconductor device.
Figure 1B:
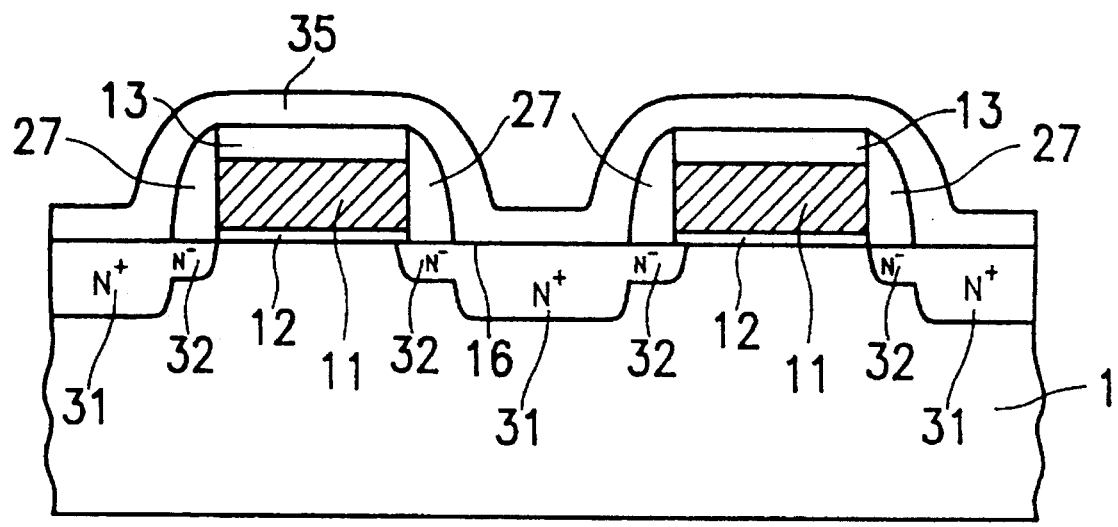
Figure 1C:
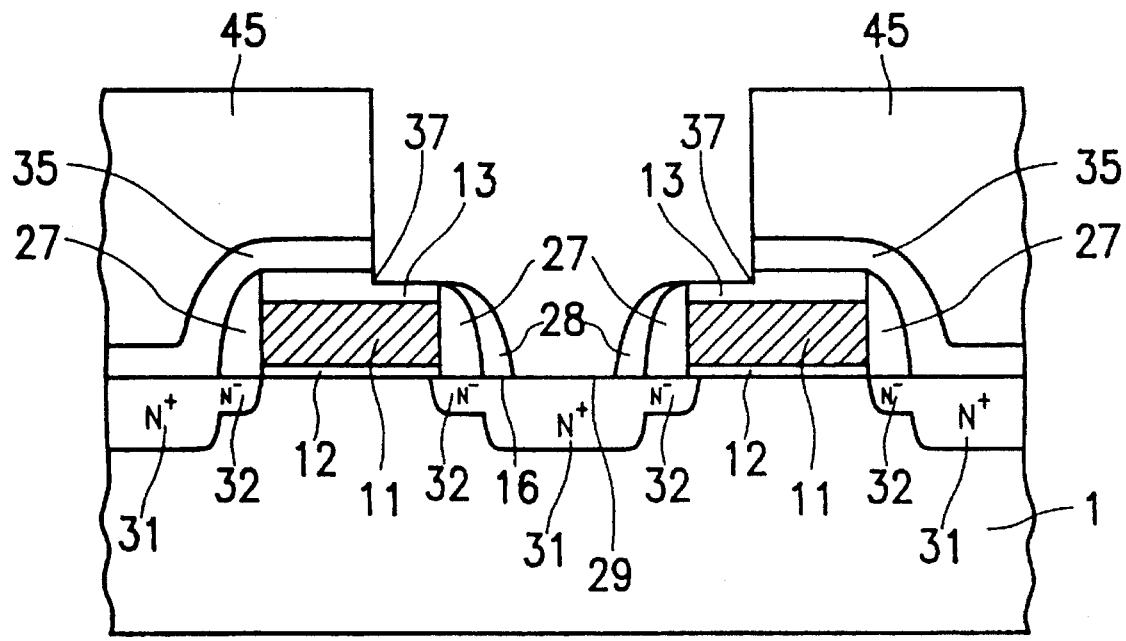
Figure 1D:
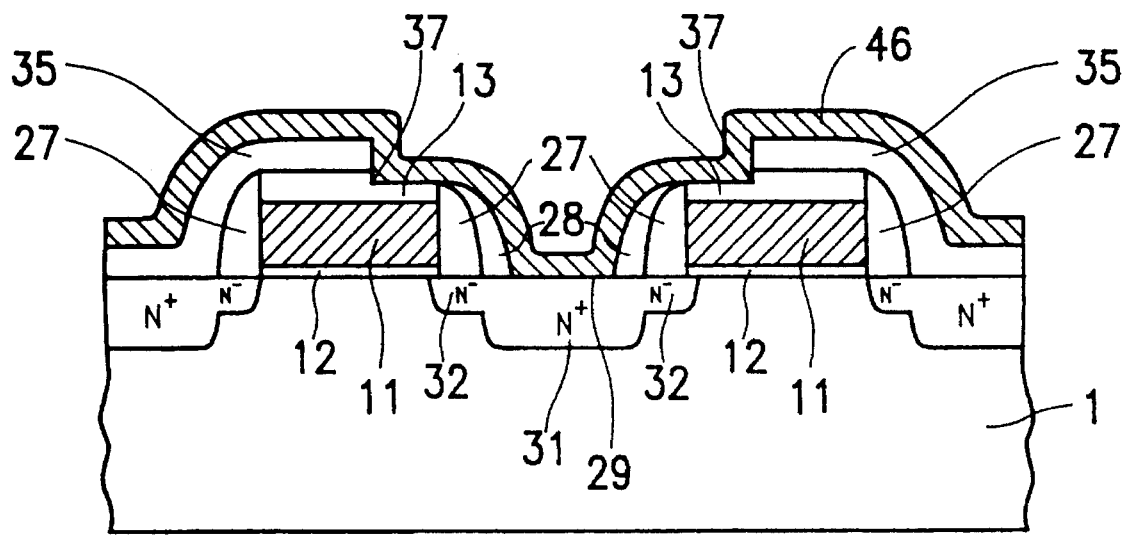
Figure 1E:
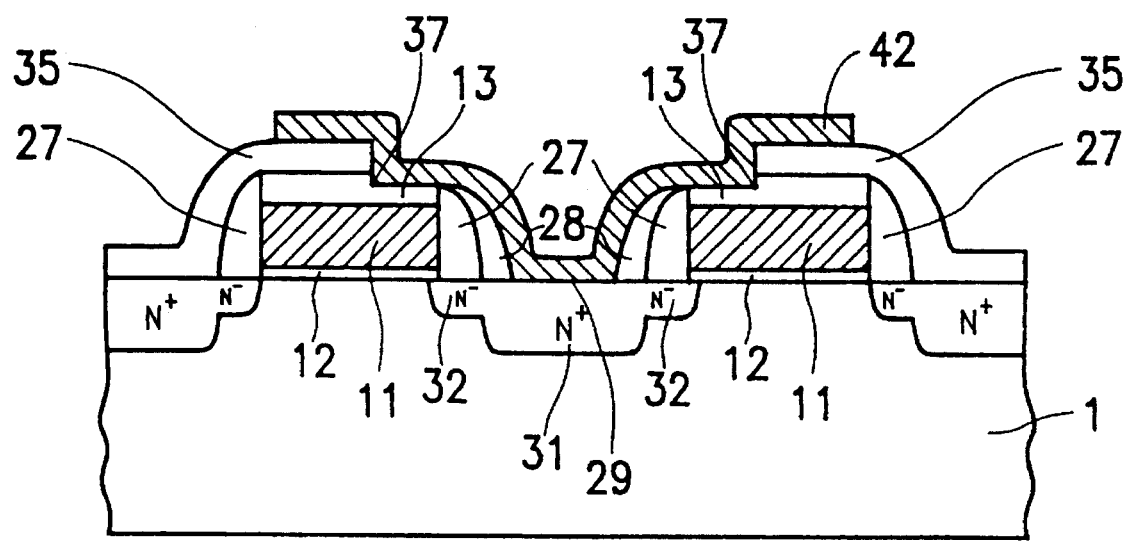
Figure 2A:
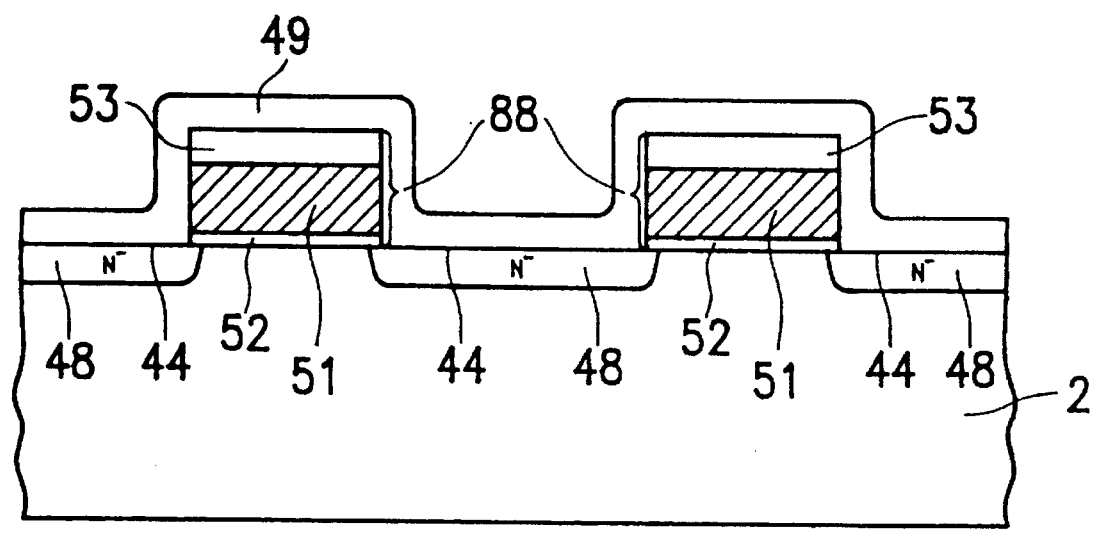
FIGS. 2a to 2e illustrate, in cross-sectional view, the process steps for fabricating a self-aligned contact of a semiconductor device in accordance with a preferred embodiment of the present invention.

Referring to FIG. 2a, first oxide layer 52, first polysilicon layer 51, and second oxide layer 53 are formed, preferably by chemical vapor deposition, on semiconductor substrate 2 successively. In order to improve the conductivity, first polysilicon layer 51 is implanted with impurities. In addition, a metal silicide layer (not shown) can be deposited on first polysilicon layer 51 to formed a "polycide" structure. Next, second oxide layer 53, first polysilicon layer 51, and first oxide layer 52 are patterned by lithography and etching processes to form gate electrode 88 and expose area 44 of semiconductor substrate 2 for source/drain regions. By using gate electrode 88 as a mask, an impurity is implanted into area 44 to form lightly doped source/drain regions 48. Third oxide layer 49 is then deposited on the surfaces of gate electrode 88 and lightly doped source/drain regions 48.

Figure 2B:
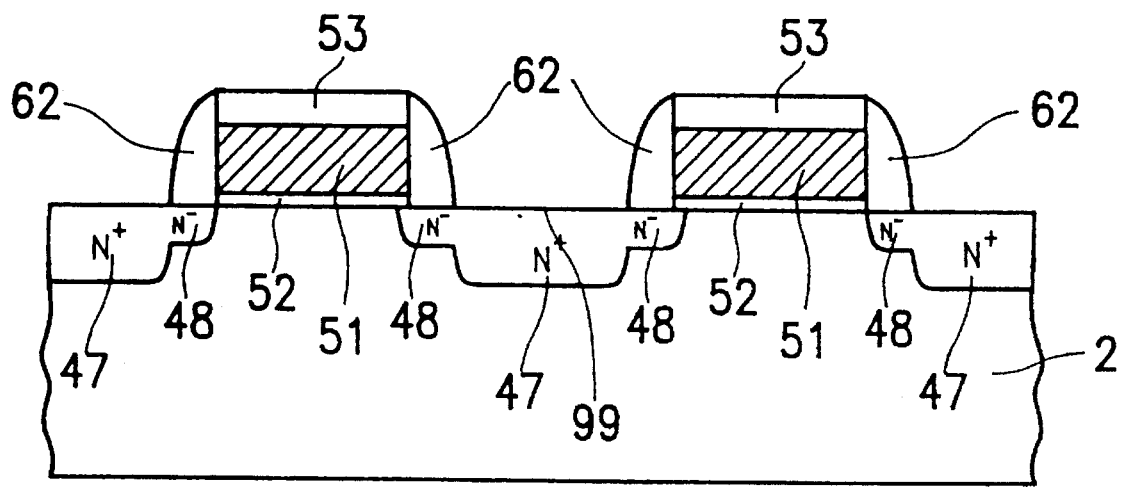

Referring to FIG. 2b, third oxide layer 49 is anisotropically etched, preferably by reactive ion etching (RIE), to leave sidewall spacer 62 on the sidewalls of gate electrode 88 and expose a portion of the lightly doped source/drain regions 48, namely contact 99. Subsequently, an impurity is then implanted into area 44 to form heavily doped source/drain regions 47 using gate electrode 88 and sidewall spacer 62 as a mask.

After that, a liquid-phase oxide-deposition (LPD) process is now performed on the substrate by using a photoresist as a mask. LPD is known as a selective deposition technique. That is, the oxide only deposits on the silicon oxide surface but not on the photoresist. This was disclosed in *IEEE, Transactions on Electron Devices*, Vol. 40, No. 8, pp. 1455 (1993), and *IEEE, Electron Device Letters*, Vol. 14, No. 8, pp. 403 (1993), which are incorporated hereby for reference. Generally, the oxide deposition is based on the following chemical reactions:

  (1)

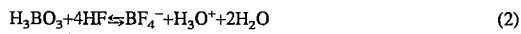  (2)

Figure 2C:
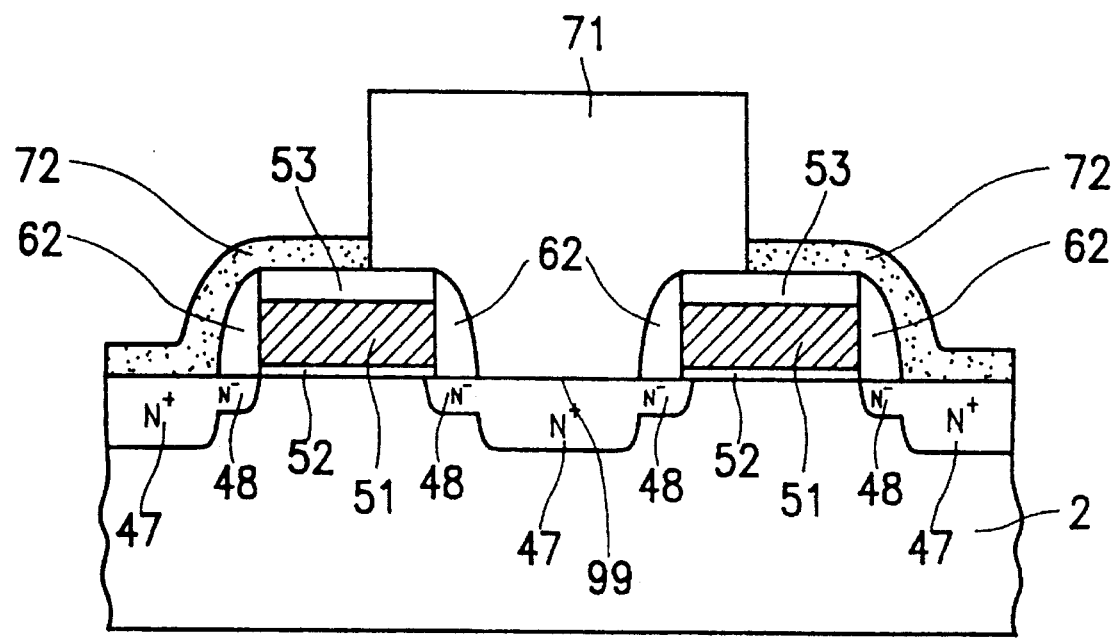

To form the oxide, the substrate is dipped in a HF solution saturated with $SiO_2$. In the solution, the chemical reaction of (1) is in a balanced condition. The addition of $H_3BO_3$ consumes HF through the reaction of (2), and thus pulls the balance of (1) from the left side to the right side. This generates a "super-saturated" condition of the HF solution. The oxide is therefore selectively precipitated on the surface of silicon oxide. For example, as can be seen in FIG. 2c, layer of photoresist 71 is coated and patterned by conventional lithography process on an area of semiconductor substrate 2 covering contact 99. Fourth oxide layer 72 is then formed in self-aligned manner by an LPD process to a thickness of between 100 Å to 3000 Å.

Figure 2D:
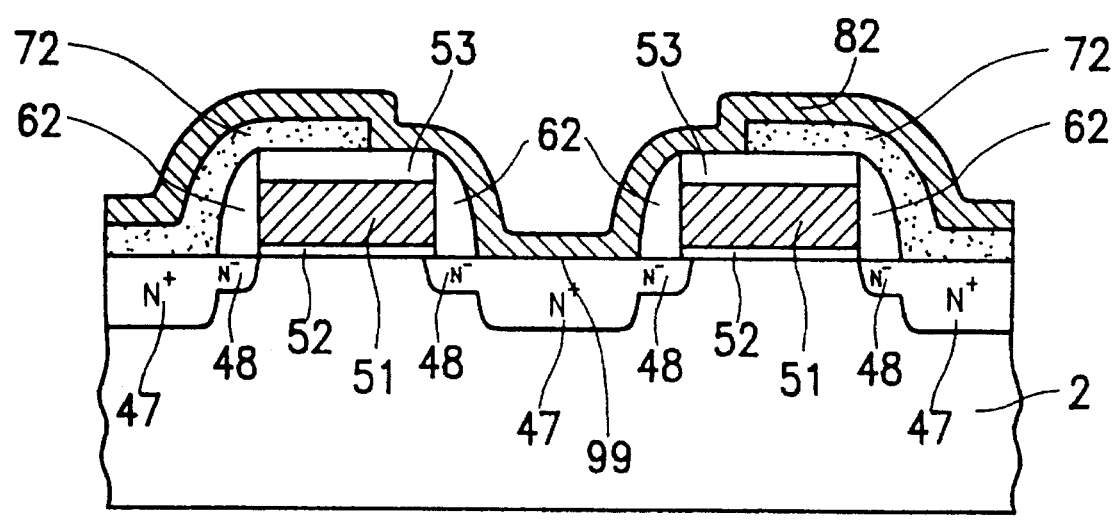
Figure 2E:
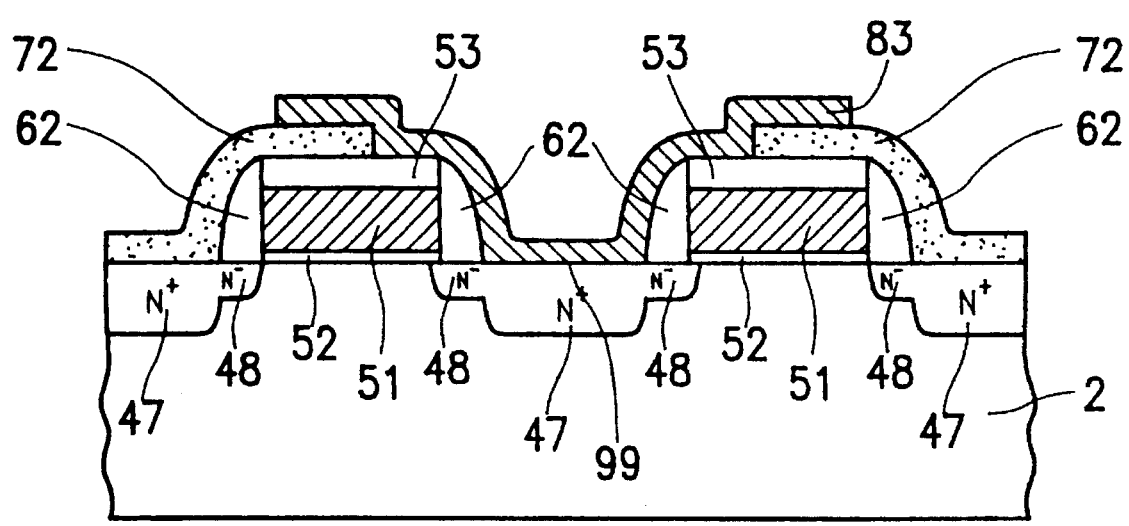

Referring to FIG. 2d, photoresist 71 is removed by an appropriate solvent, thereby exposing contact 99 of semiconductor substrate 2. Second polysilicon layer 82 is then deposited on the exposed surfaces of the substrate. Therefore, second polysilicon layer 82 is connected to heavily doped source/drain regions 47 through contact 99 in a self-aligned manner. Finally, as can be seen in FIG. 2e, second polysilicon layer 82 is patterned by conventional lithography and etching processes to form interlevel conductive layer 83. Thus, the process steps of fabricating a self-aligned contact in accordance with the preferred embodiment of this invention is completed.

It is apparent that a contact of the present invention can be achieved with some advantages. Since fourth oxide layer 72 is formed by a self-aligned LPD process instead of by deposition and etching processes, the over-etching problem of the prior art method can be prevented. Furthermore, since no additional sidewall spacer is formed on the sidewalls of sidewall spacer 62, the problem of contact area reduction is thus solved.

While the invention has been described by way of example and in terms of a preferred embodiment, it is to be understood that the invention need not be limited to the disclosed embodiment. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a self-aligned contact of a semiconductor device comprising the steps of:

forming a gate electrode on a semiconductor substrate;

forming source/drain regions on said semiconductor substrate;

coating and patterning a layer of photoresist overlying an area of said semiconductor substrate that will form a contact portion of said source/drain regions;

forming an oxide layer by a liquid-phase deposition process using said photoresist as a mask covering said contact portion of said source/drain regions;

removing said photoresist to expose the contact portion of said source/drain regions; and forming an interlevel conductive layer on said semiconductor substrate, wherein said interlevel conductive layer is connected to said source/drain regions through said contact portion.

2. The method of claim 1, wherein the step of forming a gate electrode includes the steps of:

successively forming a first oxide layer, a polysilicon layer, and a second oxide layer on said semiconductor substrate;

anisotropically etching said second oxide layer, said polysilicon layer, and said second oxide layer to form a gate electrode; and forming a sidewall spacer on sidewalls of said gate electrode.

3. The method of claim 1, wherein the step of forming a gate electrode includes the steps of:

successively forming a first oxide layer, a polysilicon layer, a metal silicide layer, and a second oxide layer on said semiconductor substrate;

anisotropically etching said second oxide layer, said metal silicide layer, said polysilicon layer and said first oxide layer to form a gate electrode; and forming a sidewall spacer on sidewalls of said gate electrode.

4. The method of claim 1, wherein the step of forming source/drain regions includes the step of implanting impurities into said semiconductor substrate using said gate electrode as a mask.

5. The method of claim 1, wherein the step of forming an oxide layer includes the step of forming an oxide layer deposited to a thickness of between 100 Å to 3000 Å by said liquid-phase deposition process.

6. The method of claim 1, wherein the step of forming an interlevel conductive layer includes the step of forming an interlevel conductive layer made of polysilicon connected to said source/drain regions through said contact portion.

7. The method of claim 1, wherein the step of forming an interlevel conductive layer includes the step of forming an interlevel conductive layer made of polycide, metal silicide/polysilicon, connected to said source/drain regions through said contact portion.

* * * * *